United States Patent [19]

Blanchard et al.

[11] Patent Number: 4,896,196
[45] Date of Patent: Jan. 23, 1990

[54] VERTICAL DMOS POWER TRANSISTOR WITH AN INTEGRAL OPERATING CONDITION SENSOR

[75] Inventors: Richard A. Blanchard, Los Altos; David Cooper, Saratoga, both of Calif.

[73] Assignee: Siliconix Incorporated, Santa Clara, Calif.

[21] Appl. No.: 243,166

[22] Filed: Sep. 8, 1988

Related U.S. Application Data

[63] Continuation of Ser. No. 929,961, Nov. 12, 1986, abandoned.

[51] Int. Cl.[4] .............................................. H01L 29/78
[52] U.S. Cl. .................................... 357/23.4; 357/38; 357/28; 357/32.14
[58] Field of Search ................... 357/23.4, 23.1, 23.8, 357/28, 43, 86, 23.14, 38, 38 T

[56] References Cited

U.S. PATENT DOCUMENTS

| | | | |
|---|---|---|---|
| 3,614,480 | 10/1971 | Berglund | 357/28 X |
| 3,801,949 | 4/1974 | Larrabee | 357/28 X |
| 4,032,953 | 6/1977 | Suzuki | 357/28 X |
| 4,126,496 | 11/1978 | Verderber | 357/28 X |
| 4,242,598 | 12/1980 | Johnson et al. | 357/28 X |
| 4,260,911 | 4/1981 | Brown et al. | 357/28 X |
| 4,618,872 | 10/1986 | Baliga | 357/23.4 |
| 4,635,086 | 1/1987 | Miwa et al. | 357/23.4 X |
| 4,698,655 | 10/1987 | Schultz | 357/28 X |
| 4,730,228 | 3/1988 | Einzinger et al. | 357/28 X |
| 4,760,434 | 7/1988 | Tsuzuki et al. | 357/28 X |

FOREIGN PATENT DOCUMENTS 5669861  6/1981  Japan ................... 357/28 X

Primary Examiner—William Mintel
Attorney, Agent, or Firm—Skjerven, Morrill, MacPherson, Franklin & Friel

[57] ABSTRACT

A vertical DMOS or IGBT cell structure with an integral operating condition sensor provided by a sensor region forming a PN junction 65 with an adjacent region of the cell and having a sensor region contact 75 for conducting a test current without interfering with normal operation of the cell.

8 Claims, 3 Drawing Sheets

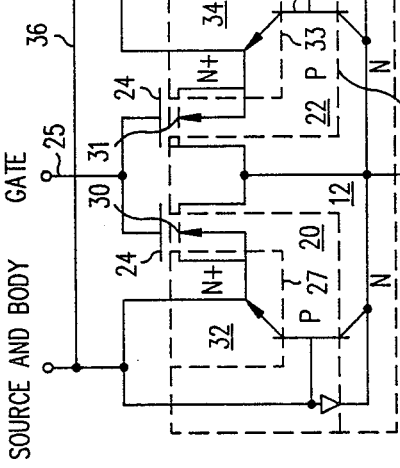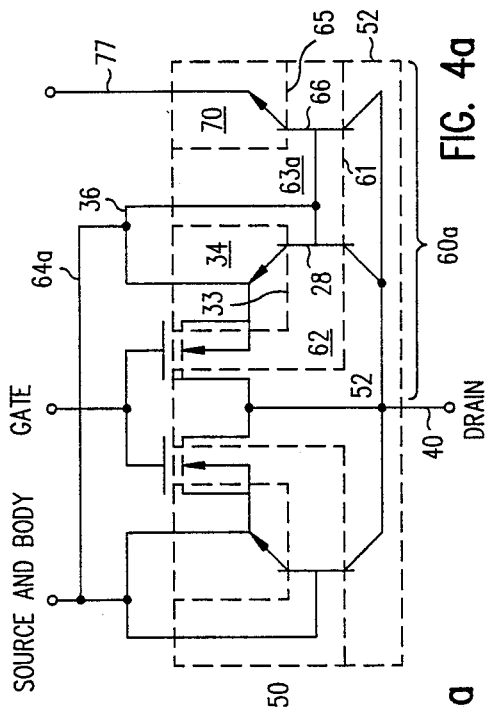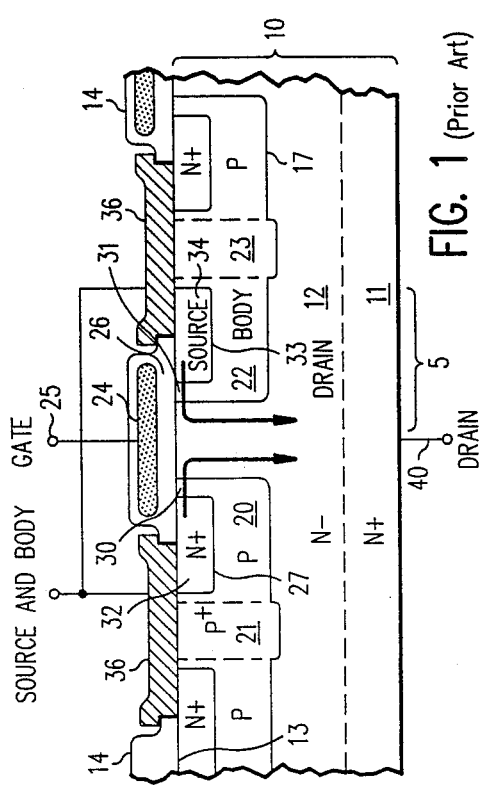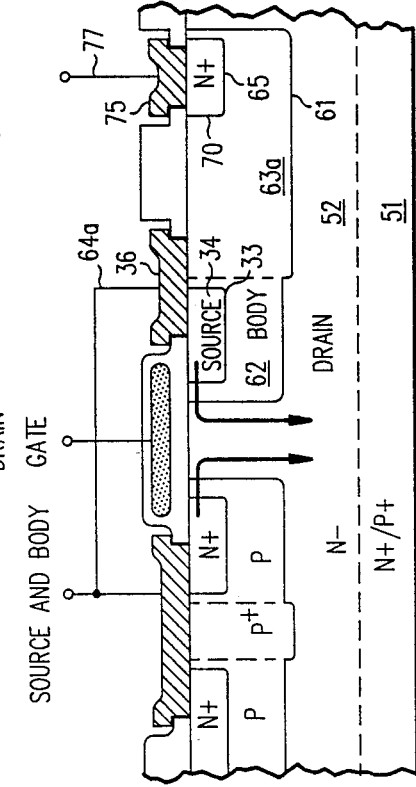
FIG. 1 (Prior Art)
FIG. 2 (Prior Art)
FIG. 3a
FIG. 4a

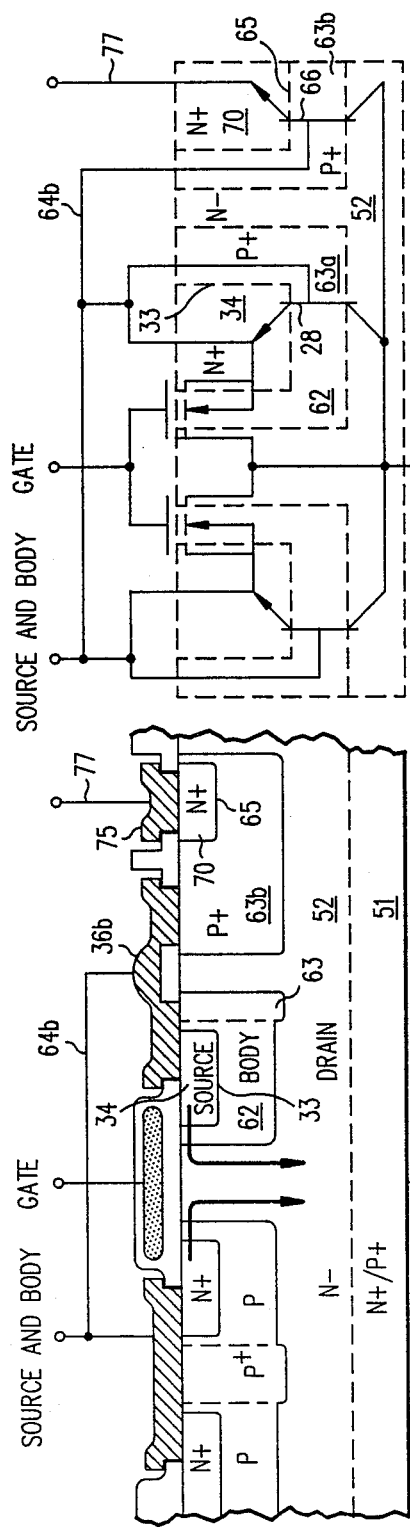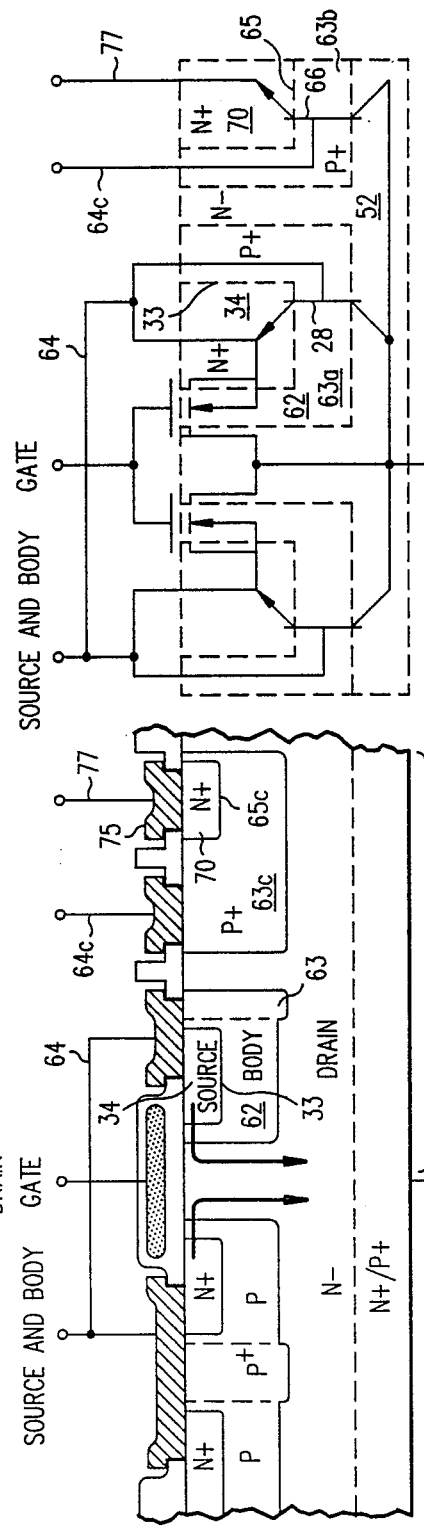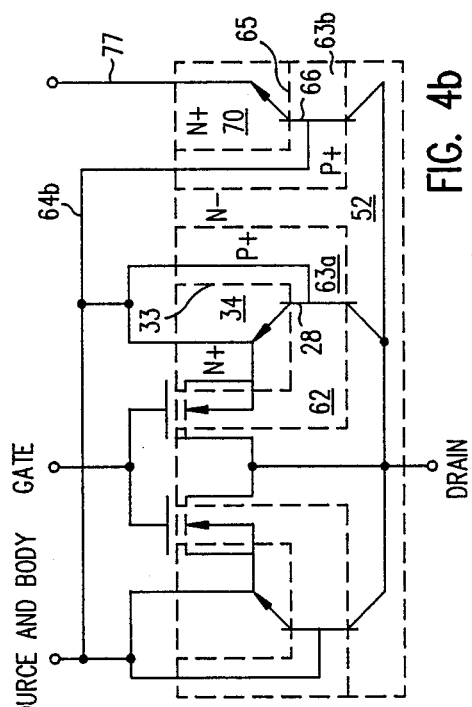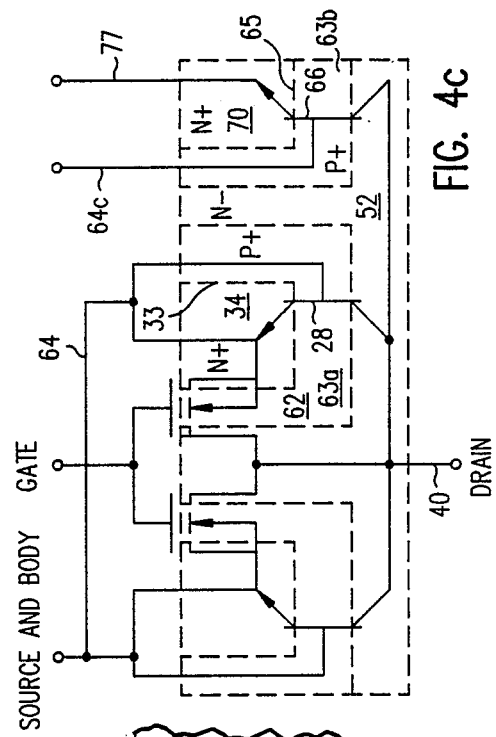

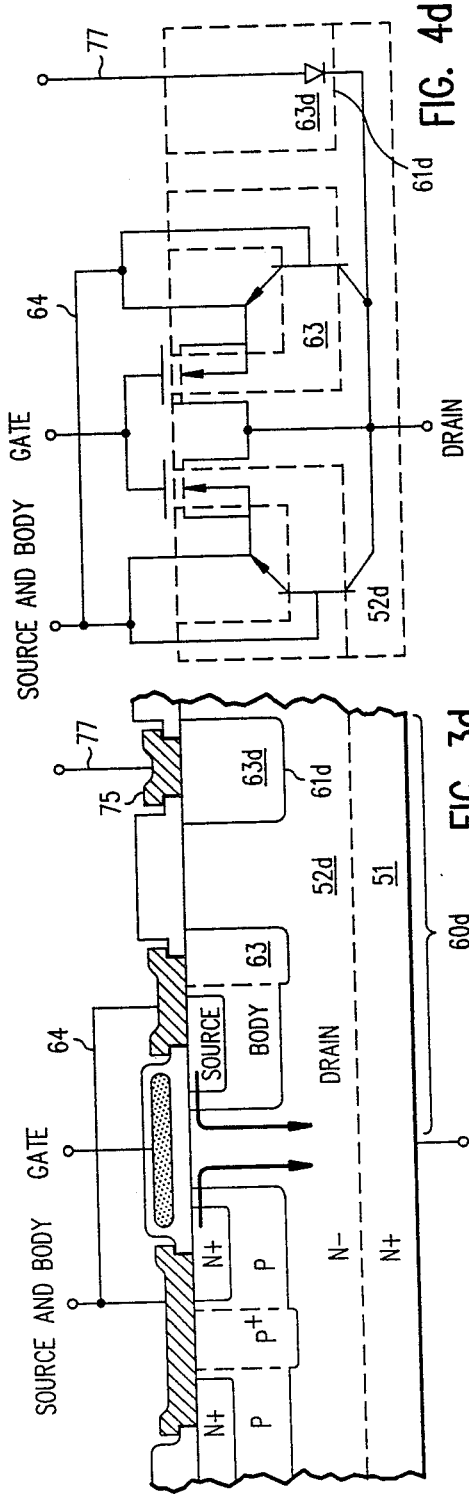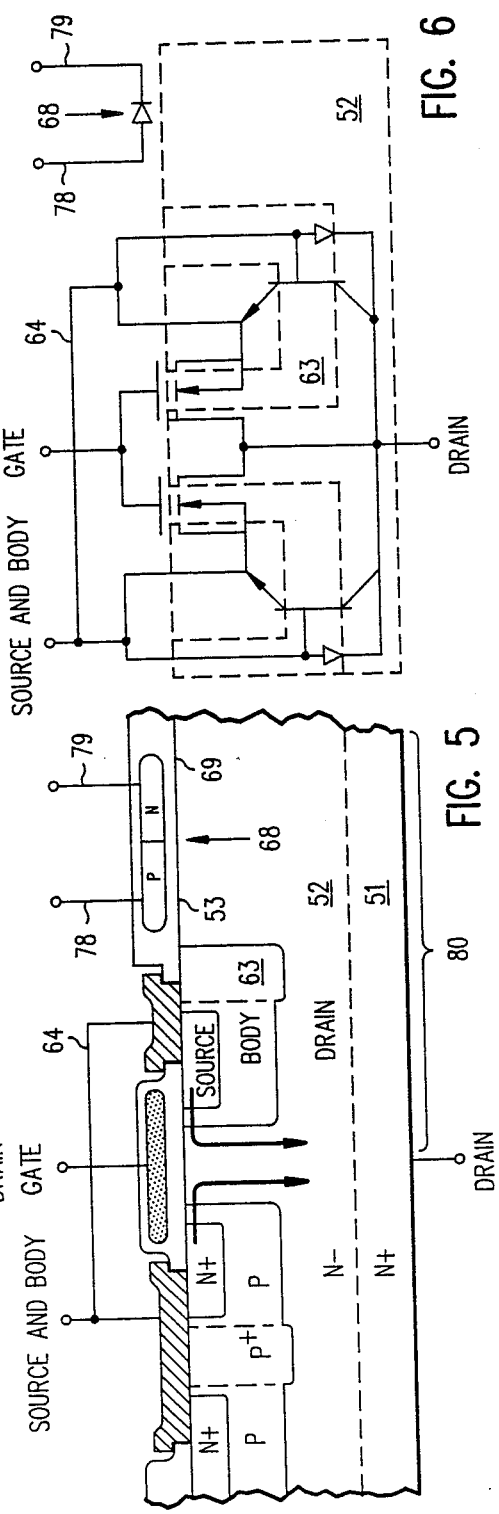

VERTICAL DMOS POWER TRANSISTOR WITH AN INTEGRAL OPERATING CONDITION SENSOR

This application is a continuation of application Ser. No. 06/929,961, filed 11/12/86, now abandoned.

BACKGROUND OF THE INVENTION

This invention relates to semiconductor devices and more specifically to a vertical double diffused metal oxide semiconductor (DMOS) power switching transistor device with an operating condition sensor.

Prior art vertical DMOS transistor devices, as described for example in U.S. Pat. Nos. 4,430,792 and 4,443,931 and reproduced in FIG. 1, are field effect transistor (FET) cell structures in which a common substrate drain 10 serves multiple vertical DMOS cells. In DMOS cell 5 located on the right side of drain lead 40 and gate lead 25 in FIG. 1, substrate drain 10 is formed from N+ wafer 11 and N− epitaxial layer 12, which sustains a high breakdown voltage. Beneath substrate surface 13, P type body diffusion 22 contains smaller, N+type source diffusion 34. On surface 13 over drain 12 and adjacent body diffusion 22, gate dielectric 26 supports polycrystalline silicon gate 24. Oxide layer 14 provides an insulation layer over the substrate surface 13. In N-channel DMOS cell 5, a positive bias applied to gate 24 establishes channel 31 across the top of body 22 for electron flow from source 34 to drain 12.

In a typical power switching DMOS device as shown in FIG. 1, a symmetrical pair of DMOS cells on the right and left share common gate electrode 24, which enables current to flow simultaneously from sources 32 and 34 through respective channels 30 and 31 to common drain 12. Body regions 22 and 23 may be portions of a continuous P+ body diffusion meeting outside the plane of FIG. 1. For multiple-ampere power switching the perimeter of source region 32 or 34 typically extends many centimeters in a series of cells or interdigitated fingers resembling in cross-section the structure of FIG. 1.

So that N+ source 34, P− body 22, and N− substrate 12 will not operate as an intrinsic NPN transistor 28, As shown in FIG. 2, junctions 27 and 33 are typically shorted on surface 13 by common source/body contact(s) 36 to the adjacent P+body regions 21 and 23. Increased conductivity deep body regions 21 and 27 also forestall junctions 31 and 33 from becoming forward biased.

Rapid switching with a large substrate drain makes DMOS devices well suited for high current density power switching applications, but high power switching dissipates large amounts of heat, which if not controlled can potentially destroy DMOS power switching devices. Therefore these devices need to be protected from overheating in some applications. Prior art DMOS devices have been protected from overheating by for example heat sink casings and/or external current limiting circuits. A thermal sensor can be positioned nearby and used in a feedback loop to control current, and thus temperature, in a DMOS device. However, these prior art methods may not indicate temperature precisely in channel 22 and upper drain 12, or the amperage flowing through cell 5, FIG. 1. Large area devices such as high current DMOS transistors or other MOS gated devices can have sharp temperature gradients, making it important to sample temperatures near high current density regions.

One DMOS cell temperature measuring technique uses one of the cell's PN junctions for a test current, which is a function of junction bias and temperature. Such a junction test current is a more direct and accurate measurement of temperature than a normal operating cell channel current measurement, which also depends upon source-to-gate bias. To measure the operating cell 5 current between leads 36 and 40 across junction 17, independently of a channel 31 current, gate 24 must be grounded and the lead 36-to-lead 40 bias must be reversed, interrupting normal operation of cell 5. In many applications, continuous operation and/or external circuit requirements prohibit interrupting DMOS transistor operation for such measurements.

A prior art technique reported in *Electronic Design,* June 28, 1984, pp. 50–52, monitors operating DMOS device condition with a current mirror circuit, not shown. Current through a first transistor (e.g. the left side of FIG. 2) is mirrored by proportional current through a second (mirror) transistor (e.g. the right side of FIG. 2). The mirrored current can be measured through a resistor, not shown, in FIG. 2 in series with lead 36, to indicate temperature without interrupting operation of the first transistor.

Since a power DMOS transistor can overheat and fail even when conducting a low average current, these prior art current sense techniques do not provide immunity from all conditions leading to device failure. There remains, therefore, a need for a DMOSFET power switching device in which temperature can be measured directly, accurately, and without interfering with device operation.

SUMMARY

The present invention provides a DMOS power switching cell structure with an integral temperature sensor for accurately measuring temperature in the immediate vicinity of high density current, without interfering with normal power switching operation of the cell.

While avoiding interference with operation, the invention makes an accurate temperature measurement by measuring a test current through, or a test voltage across a PN junction, provided by at least one new region of conductivity type opposite to the surrounding region of the cell, body with a new electrical contact to the at least one region, and optionally a second electrical contact to the body surrounding the first region.

A first embodiment provides a DMOS cell with a new diode well in an extended deep body region, and provides an electrical contact to the new diode well. A second embodiment provides a new diode well and contact in a new deep body region separate from, but still sharing a contact with, the channel body region. A third embodiment provides a new diode well in a new separate body region, each with its own electrical contact. A fourth embodiment provides a new diode well in the form of a body region separate from the channel body region, and having its own contact. A fifth embodiment provides two new regions forming a diode insulated by dielectric over the surface of the substrate.

BRIEF DESCRIPTION OF THE DRAWINGS

FIG. 1 is a cross section of a prior art vertical DMOS transistor including two cells;

FIG. 2 is a schematic of the structure of FIG. 1;

FIGS. 3a, 3b, 3c, and 3d are cross sections of vertical DMOS transistor devices each having an integral temperature sensing diode according to the present invention;

FIGS. 4a, 4b, 4c, and 4d are schematics of the respective FIG. 3 structures;

FIG. 5 is a cross section of another embodiment of the present invention which forms a temperature sensing diode from single crystal or polycrystalline silicon which is electrically isolated from the DMOS device; and FIG. 6 is a schematic of the structure of FIG. 5.

DETAILED DESCRIPTION

The present invention provides a vertical DMOS power switching cell with an integral operating condition sensor, in alternate embodiments as cells 60a, 60b, 60c, 60d, and 80, in cross-section FIGS. 3a, 3b, 3c, 3d, and 5, respectively. Equivalent circuits are shown in schematic FIGS. 4a, 4b, 4c, 4d, and 6, respectively, with some regions corresponding to regions of FIG. 1 DMOS cell 5 described above. Unlike prior art cell 5 (see FIG. 1) with deep body region 23, this invention in FIG. 3a cell 60a modifies deep body region 63a to have a greater lateral dimension, and to include additional and oppositely predoped or implanted well region 70. Well 70 serves as the cathode of diode 65 formed by the PN junction with body 63a, which serves as the anode. In other embodiments, not shown, conductivity types of all regions are reversed to provide a body region cathode and a well region anode.

As explained with reference to FIGS. 1 and 2 prior art DMOS cell 5, in FIG. 3a cell 60a, drain region 52, body region 62, and source region 34 form intrinsic NPN transistor 28, FIG. 4a. Similarly, well 70 added to body region 63a and substrate 52 forms intrinsic NPN transistor 66, FIG. 4a. When lead 75 does not forward bias transistor 66 base-emitter junction 65, transistor 66 is off and does not interfere with the normal switching operation of cell 60a. However, when lead 75 is biased negatively with respect to channel/body lead 64a, to cause a test current across junction 65, then during normal operation of cell 60a, positively biased region 52 can provide a collector current to turn on transistor 66, adding lead 40 current to the lead 64a current measured across junction 65 and out lead 75. To minimize this addition of current from lead 40, the intrinsic NPN transistor 66 current gain should be sufficiently low so that the collector 52 to emitter 70 with base 63a open breakdown voltage (BVceo) is not significantly lower than collector 52 to base 63a with emitter 70 breakdown voltage with the emitter shorted to the base (BVces). One way of obtaining low gain is to control doping so that base region 63a has a relatively high P-type dopant concentration compared to adjacent emitter junction 65 to obtain a low emitter injection efficiency, and to control doping so that base region 63a has a high net P-type dopant concentration per unit surface area of the base between base-emitter junction 65 and base-collector junction 61 to obtain a low base transport factor.

In FIG. 3b and 3c, alternate embodiment cells 60b and 60c have sensor anode body regions 63b and 63c which are electrically isolated from P+ body regions 63. Corresponding schematic diagrams are shown in FIGS. 4b and 4c. In FIG. 3b, P+ body region 63b is electrically connected through overlying interconnect lead 36b, for example aluminum metallization, to body region 63. In FIG. 3a or 3b, use of base-emitter junction 65 to measure the temperature within cell 60a or 60b requires only one additional cathode contact 75. Alternatively, FIG. 3c cell 60c provides a second additional lead 64c to body region 63c, so that both terminals of diode 65c are accessible, and test current does not have to use lead 64, which may be subject to transient effects during switching. This configuration allows a variety of electrical connections for sensing temperature.

The invention in an alternate embodiment as cell 60d in FIGS. 3d and 4d provides isolated P+ region 63d without an N+ well. P+ region 63d forms the anode of diode 61d with N− cathode region 52d. The absence of an intrinsic NPN transistor 66 mitigates the problem of reduced breakdown voltage. The embodiment of FIG. 3d allows sensor diode 61d to be electrically referenced to drain region 52d.

FIGS. 5 and 6 show another embodiment of the invention in which cell 80 diode 68, formed in polycrystalline silicon or single crystal silicon recrystallized from poly silicon, is electrically isolated by dielectric 69, for example $SiO_2$, from surface 53. Sensor diode 68 may be referenced to any external circuit voltage through anode lead 78 and cathode lead 79.

Sensor diodes according to the present invention are formed similarly in combination DMOS-bipolar (insulated gate bipolar) transistor (IGBT) devices which correspond to DMOS transistors with the addition of a fourth region beneath, and of opposite conductivity type from, an epitaxial layer serving as region 52, as shown, for example, in U.S. Pat. No. 4,443,931. In an IGBT, substrate 50 (see, for example, FIG. 3a) comprises a second conductivity type wafer 51 for an IGBT anode, and a first conductivity type epitaxial layer 52 for the DMOS drain region.

The present invention is compatible for use with a current mirror configuration to measure current as described above with reference to FIG. 2, if it is desired to measure current separately from measuring temperature.

A preferred embodiment has been illustrated, of which modifications and adaptions within the scope of the invention will occur to those skilled in the art. The invention is limited only by the scope of the following claims.

We claim:

1. In a vertical DMOS semiconductor structure in which a drain of said vertical DMOS structure is formed in a semiconductor substrate, a body region of said vertical DMOS semiconductor structure having a conductivity type opposite the conductivity type of said drain is formed within said drain, and a source of said vertical DMOS semiconductor structure having a conductivity type opposite said conductivity type of said body region is formed within said body region a structure for sensing temperature comprising:

an operating condition sensor region within said drain of said vertical DMOS semiconductor structure comprising:

a sensor body region having the same conductivity type as said body region of said vertical DMOS semiconductor structure, said sensor body region being joined with said body region of said vertical DMOS structure;

a sensor source region having a conductivity type opposite that of said sensor body region; and a contact attached to said sensor source region for forward biasing said sensor source region with respect to said sensor body region, wherein, when said contact is biasing said sensor source region, said operating condition sensor region conducts a current related to a temperature of said vertical DMOS structure.

2. A structure as in claim 1 in which said sensor body region is doped sufficiently so that the parasitic bipolar transistor formed by said sensor source region, said sensor body region, and said drain has a current gain not significantly greater than unity at biasing levels.

3. In a vertical DMOS semiconductor structure in which a drain of said vertical DMOS structure is formed in a semiconductor substrate, a body region of said vertical DMOS semiconductor structure is formed within said drain, and a source of said vertical DMOS semiconductor structure is formed within said body region, a structure for sensing temperature comprising:
 an operating condition sensor region comprising a diode located on the surface of said semiconductor substrate proximate to said vertical DMOS semiconductor structure;
 a pair of contacts, one contact coupled to an anode of said diode and the other contact coupled to a cathode of said diode, for applying voltage to and detecting current through said operating condition sensor region;
 wherein, when said voltage is applied by said pair of contacts, said operating condition sensor region conducts a current related to temperature of said vertical DMOS structure.

4. A structure for sensing temperature as in claim 3 in which said operating condition sensor region comprises a diode and a dielectric material, said dielectric material located so as to electrically insulate said diode from said drain region.

5. A structure for sensing temperature as in claim 1 in which said vertical DMOS semiconductor structure is part of an insulated gate bipolar transistor device, said insulated gate bipolar transistor device comprising:
 a substrate layer of a first conductivity type;
 a first region adjacent said substrate layer having a second conductivity type opposite said first conductivity type, said first region serving as said drain;
 a second region within said first region having said first conductivity type serving as said body region;
 a third region within said second region having said second conductivity type and serving as said source; and
 a gate formed over at least a portion of said second region for controlling current flow between said first and third regions.

6. In a vertical DMOS semiconductor structure in which a drain of said vertical DMOS structure is formed in a semiconductor substrate, a body region of said vertical DMOS semiconductor structure having a conductivity type opposite the conductivity type of said drain is formed within said drain, and a source of said vertical DMOS semiconductor structure having a conductivity type opposite said conductivity type of said body region is formed within said body region, a structure for sensing temperature comprising:
 an operating condition sensor region within said drain of said vertical DMOS semiconductor structure comprising:
  a sensor body region having the same conductivity type as said body region of said vertical DMOS semiconductor structure, said sensor body region being separate from said body region of said vertical DMOS structure;
  a sensor source region having a conductivity type opposite that of said sensor body region; and
  a contact attached to said sensor source region for forward biasing said sensor source region with respect to said sensor body region,
 wherein, when said contact is biasing said sensor source region, said operating condition sensor region conducts a current related to a temperature of said vertical DMOS structure.

7. A structure as in claim 6 wherein said body region of said vertical DMOS structure and said sensor body region are electrically connected together by a conductor.

8. A structure as in claim 6 wherein said body region of said vertical DMOS structure and said sensor body region are contacted by separate electrical conductors.

* * * * *